(12) United States Patent
Madhani et al.

(10) Patent No.: US 7,271,485 B1
(45) Date of Patent: Sep. 18, 2007

(54) SYSTEMS AND METHODS FOR DISTRIBUTING I/O IN A SEMICONDUCTOR DEVICE

(75) Inventors: Parag N. Madhani, Allentown, PA (US); Paul F. Barnes, Coplay, PA (US); Donald E. Hawk, Jr., King of Prussia, PA (US); Kandaswamy Prabakaran, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 68 days.

(21) Appl. No.: 11/530,550

(22) Filed: Sep. 11, 2006

(51) Int. Cl.
*H01L 23/48* (2006.01)
*H01L 21/4763* (2006.01)

(52) U.S. Cl. .................. 257/738; 257/758; 257/778; 257/786; 438/618; 438/612; 438/667

(58) Field of Classification Search ........ 257/738–739, 257/777–778, 786, 765, 758, 771; 438/612, 438/618
See application file for complete search history.

(56) References Cited

U.S. PATENT DOCUMENTS

| | | | |
|---|---|---|---|
| 5,751,065 A | 5/1998 | Chittipeddi | |
| 5,888,837 A * | 3/1999 | Fillion et al. | ............ 438/15 |
| 5,900,674 A | 5/1999 | Wojnarowski | |
| 5,920,731 A | 7/1999 | Pletl | |
| 5,938,452 A | 8/1999 | Wojnarowski | |
| 6,071,829 A | 6/2000 | Starck | |
| 6,087,851 A | 7/2000 | Kim | |
| 6,465,884 B1 | 10/2002 | Fischer | |
| 6,507,113 B1 | 1/2003 | Fillion | |
| 6,563,340 B1 | 5/2003 | Jones | |
| 6,650,015 B2 * | 11/2003 | Chen et al. | ............ 257/738 |
| 6,833,286 B2 | 12/2004 | Fischer | |
| 7,064,915 B1 | 6/2006 | Spaur | |
| 2003/0146508 A1* | 8/2003 | Chen et al. | ............ 257/738 |
| 2005/0042786 A1 | 2/2005 | Black | |
| 2006/0081967 A1 | 4/2006 | Ha | |

OTHER PUBLICATIONS

Ghaffarian, Reza, "Joint Integrity of Chip-Scale Packages Under Thermal Isolation", Jul. 1998 (printed from web Aug. 17, 2006), pp. 1-10, published http://www.chipscalereview.com.

* cited by examiner

*Primary Examiner*—Dung A. Le
(74) *Attorney, Agent, or Firm*—Hamilton, DeSanctis & Cha LLP

(57) ABSTRACT

Various systems and methods for implementing multi-mode semiconductor devices are discussed herein. For example, a multi-mode semiconductor device is disclosed that includes a device package with a number of package pins. In addition, the device includes a semiconductor die with at least two IO buffers. One of the IO buffers is located a distance from a particular package pin and another of the IO buffers is located a greater distance from the particular package pin. The IO buffer located closest to the package pin includes first bond pad electrically coupled to a circuit implementing a first interface type and a first floating bond pad, and the other IO buffer includes a second bond pad electrically coupled to a circuit implementing a second interface type and a second floating bond pad. In some cases, the first floating bond pad is electrically coupled to the circuit implementing the second interface type via a metal layer wire, and the first floating bond pad is electrically coupled to the particular package pin.

18 Claims, 8 Drawing Sheets

SYSTEMS AND METHODS FOR DISTRIBUTING I/O IN A SEMICONDUCTOR DEVICE

BACKGROUND OF THE INVENTION

The present invention is related to connecting IO from a semiconductor die to a package. More particularly, the present invention is related to systems and methods for connecting one of multiple interface types implemented on a semiconductor die to appropriate pins on different packages encapsulating a substantially similar semiconductor die.

A typical semiconductor design provides a number of IO buffers that are carefully placed around the periphery of a semiconductor die to be in proximity to package pins to which the IO buffers will be bonded. FIG. 1a shows an example of such a layout approach where a semiconductor die includes a number of IO buffers 110 surrounding the periphery of a semiconductor die 100, with each IO buffer 110 located in proximity to respective package pins 120. Each of IO buffers 110 include a single bond pad indicated by the cross-hatched area on the respective IO buffers 110. Some of IO buffers 110 are electrically coupled to package pins 120 by bonding wires 130. Other of the IO pads 110 are bonded to a ground plane 150 indicated by the lined area surrounding semiconductor die 100, or to a power plane 160 indicated by the stippled area surrounding semiconductor die 100. The different IO buffers are coupled to electrical circuitry on semiconductor die 100 that implement different interface types. In particular, IO buffer 110b and IO buffer 110c are electrically coupled to a circuit implementing an interface A. IO buffer 110d and IO buffer 110e are electrically coupled to a circuit implementing an interface B. IO buffer 110h, IO buffer 110i, IO buffer 110j, IO buffer 110k and IO buffer 110l are electrically coupled to a circuit implementing an interface C. IO buffer 110o, IO buffer 110p, IO buffer 110q, IO buffer 110r and IO buffer 110u are electrically coupled to a circuit implementing an interface D. IO buffer 110v and IO buffer 110w are electrically coupled to a circuit implementing an interface E; and IO buffer 110x and IO buffer 110y are electrically coupled to a circuit implementing an interface F.

Turning to FIG. 1b, one conventional circuit 199 for connecting an IO buffer to associated interface circuitry is depicted. Circuit 199 may be implemented for each of IO buffers 110 shown in FIG. 1a. Circuit 199 includes a semiconductor substrate 177 with a number of metal layers 162, 184, 188, 192, 196 disposed thereon. Each of metal layers 162, 184, 188, 192, 196 is separated from adjacent metal layers and semiconductor substrate 177 by insulating layers 164, 182, 186, 190, 194, 198. In addition, IO buffer 110 includes a bond pad 112. Bond pad 112 includes two bond pad layers 170, 171 interconnected by a number of vias 172. Bond pad 112 is further connected to underlying circuitry by way of a via 175. As shown, via 175 electrically couples bond pad 112 to a wire on metal layer 184, but could connect bond pad 112 to lower metal layers where such was desired.

In an ideal situation, bond wires 130 are as short as possible and extend directly to an adjacent package pin without crossing another bond wire or requiring any substantial directional changes. To accommodate this ideal situation, semiconductor die 100 of FIG. 1a may be designed such that IO buffers are located at the ideal locations such that they are aligned with respective package pins. Thus, a semiconductor die is often designed with some consideration of the final interfaces that will be supported and into which package the semiconductor die will be encapsulated. For most designs, such an approach is possible, however, it can be costly. In particular, while all interfaces are offered, the device may result in higher than necessary part costs and at times an uncompetitive price point for a given part. In addition, such an approach may result in inordinately high pin count packages that are not compatible with particular end designs or form factors.

Other approaches to reduce interfaces offered and thereby reduce pin count include implementing various versions of the semiconductor design that each contemplate a particular IO set and package. Such an approach, however, is costly as it requires the maintenance of different designs, the production of different semiconductor die, and in some cases a reduction of overall yield. Again, the aforementioned limitations may combine to render a device uncompetitive.

Another option is to implement a custom package design, or force a given semiconductor design into selected package that is not optimized for the semiconductor die. Neither option is ideal as a custom package design may introduce yield problems, and in any event may be costly. Turning to FIG. 1c, an example of forcing a particular die into a selected package is depicted. Semiconductor die 100 may be packaged in a package including fewer package pins compared with that shown in FIG. 1a. In such a case, the reduced number of package pins may reduce the number of interfaces that are implemented. Thus, as shown, only interface B, interface D, interface E and interface F are provided at the package pins. In using a different package, it may be necessary to use long bond wires 130 to extend from IO buffers associated with the desired interface circuitry and the selected package pins. While such an approach may be possible in some circumstances, it may not be ideal as the length of the bond wires is increased. Further, in some cases, such an approach may not be possible due to the length of bond wires and/or cross over between the bond wires with the potential of electrical shorts associated therewith.

Hence, for at least the aforementioned reasons, there exists a need in the art for advanced systems and methods for providing flexibility in packaging a semiconductor die and/or implementing the semiconductor die.

BRIEF SUMMARY OF THE INVENTION

The present invention is related to connecting IO from a semiconductor die to a package. More particularly, the present invention is related to systems and methods for connecting one of multiple interface types implemented on a semiconductor die to appropriate pins on different packages encapsulating a substantially similar semiconductor die.

Various embodiments of the present invention provide systems and methods for implementing multi-mode semiconductor devices. In particular, one embodiment of the present invention provides a multi-mode semiconductor device that includes a device package with a number of package pins. In addition, the device includes a semiconductor die with at least two IO buffers. One of the IO buffers is located a distance from a particular package pin and another of the IO buffers is located a greater distance from the particular package pin. The IO buffer located closest to the package pin includes first bond pad electrically coupled to a circuit implementing a first interface type and a first floating bond pad, and the other IO buffer includes a second bond pad electrically coupled to a circuit implementing a second interface type and a second floating bond pad. In some cases, the first floating bond pad is electrically coupled to the circuit implementing the second interface type via a metal layer wire, and the first floating bond pad is electrically coupled to the particular package pin. In some cases, the metal layer wire is on a metal layer at a level coincident with the first floating bond pad. In one particular case, the metal layer is an aluminum metal layer and the first floating bond pad is formed of aluminum.

The two different interface types may be, but are not limited to, a USB interface, a 1394 interface, and an ATA interface. In one particular case, the first bond pad is electrically coupled to the circuit implementing the first interface type by way of a first via extending substantially vertically below the first bond pad; and the second bond pad is electrically coupled to the circuit implementing the second interface type by way of a second via extending substantially vertically below the second bond pad. In such a case, the second bond pad may be implemented in aluminum, and the via may connect the second bond pad to a copper metal layer.

Other embodiments of the present invention provide multiple IO supporting semiconductor devices. Such devices include at least one IO buffer that is located in proximity to a device package pin. The IO buffer includes a first bond pad and a second bond pad, with only one of the two bond pads being electrically coupled to the device package pin. One or more of the bond pads may be a floating bond pad. In one case, the first bond pad is a floating bond pad, and the second bond pad is electrically coupled to circuitry by way of a via extending substantially vertically below the second bond pad. In such a case, the second bond pad may be implemented in aluminum, and the via connects the aluminum bond pad to a copper metal layer disposed under the bond bad. In various cases, the floating bond pad is electrically coupled to a circuit element via a metal layer wire on a metal layer at a level coincident with the floating bond pad. In one particular case, the metal layer is an aluminum metal layer.

In some cases, the first bond pad is electrically coupled to a first driver circuit element by way of a via extending substantially vertically below the first bond pad, and the second bond pad is electrically coupled to a second driver circuit element via a metal layer wire on a metal layer at a level coincident with the second bond pad. In such a case, the second driver circuit element may be electrically coupled to the package pin via a bonding wire extending from the package pin to the second bond pad. Alternatively, the first driver circuit element may be electrically coupled to the package pin via a bonding wire extending from the package pin to the first bond pad. In some cases, the package pin is associated with a device package that encapsulates the semiconductor device. In some such cases, only one of the two interface types is provided at the IO of the device package even though both of the interface types are implemented on the semiconductor device. In some cases, one or both of the bond pads of the IO buffer are implemented using CUP technology.

Yet other embodiments of the present invention provide methods for manufacturing a multi-mode semiconductor device. The methods include providing a semiconductor die that includes a first IO buffer and a second IO buffer. The first IO buffer includes a first bond pad electrically coupled to a circuit implementing a first interface type and a floating bond pad. The second IO buffer includes a second bond pad electrically coupled to a circuit implementing a second interface type. The methods further include providing a package that includes a package pin, forming a metallization layer, and etching or otherwise forming a wire as part of the metallization layer. By forming a wire on the metallization layer, the floating bond pad is electrically coupled to the second bond pad and thereby to the circuit implementing the second interface type. In addition, a bond wire is placed between the floating bond pad and the package pin.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1A:
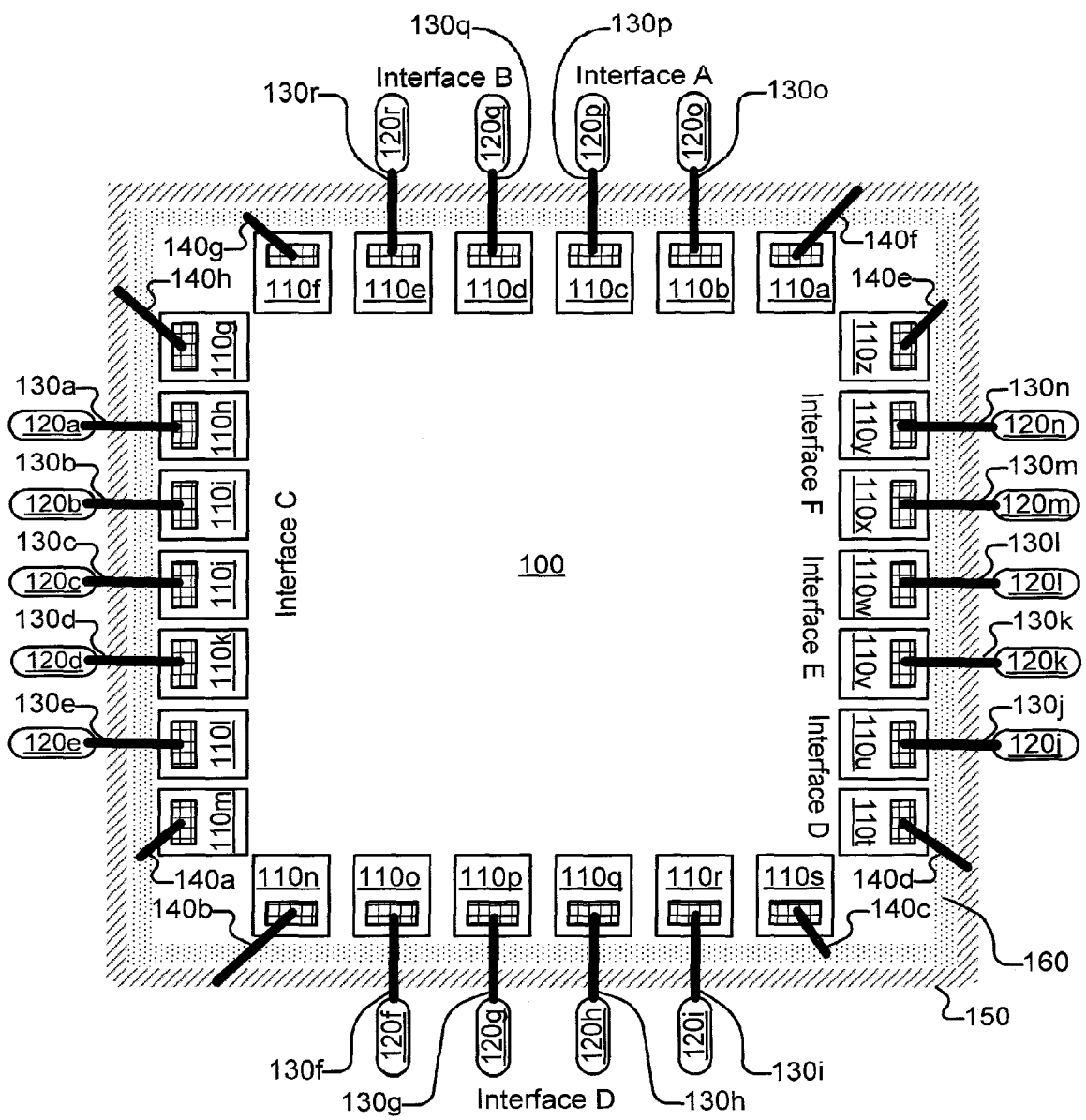
FIG. 1 depict a prior art approach to implementing a semiconductor device including multiple IO interfaces.
Figure 1B:
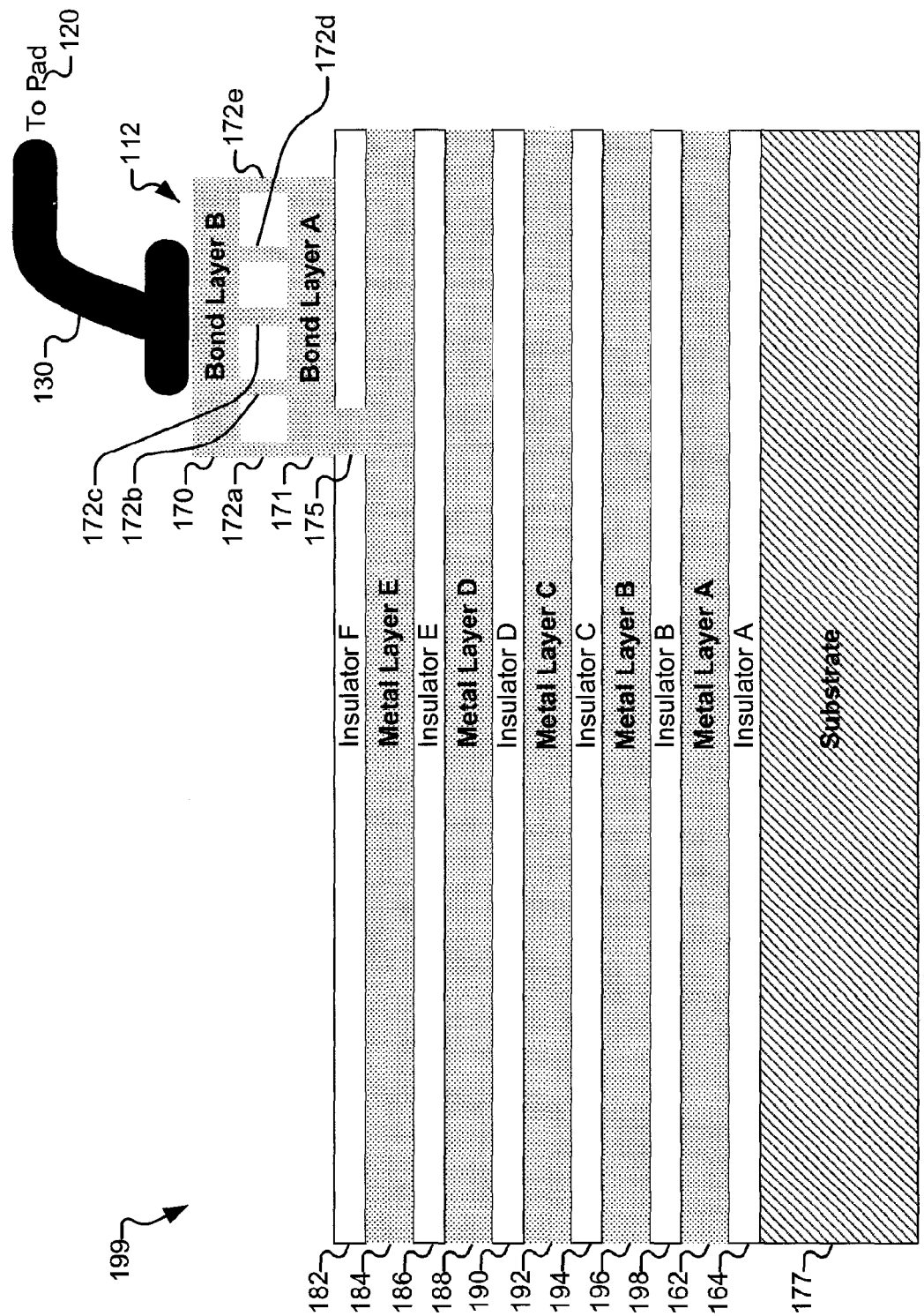
Figure 1C:
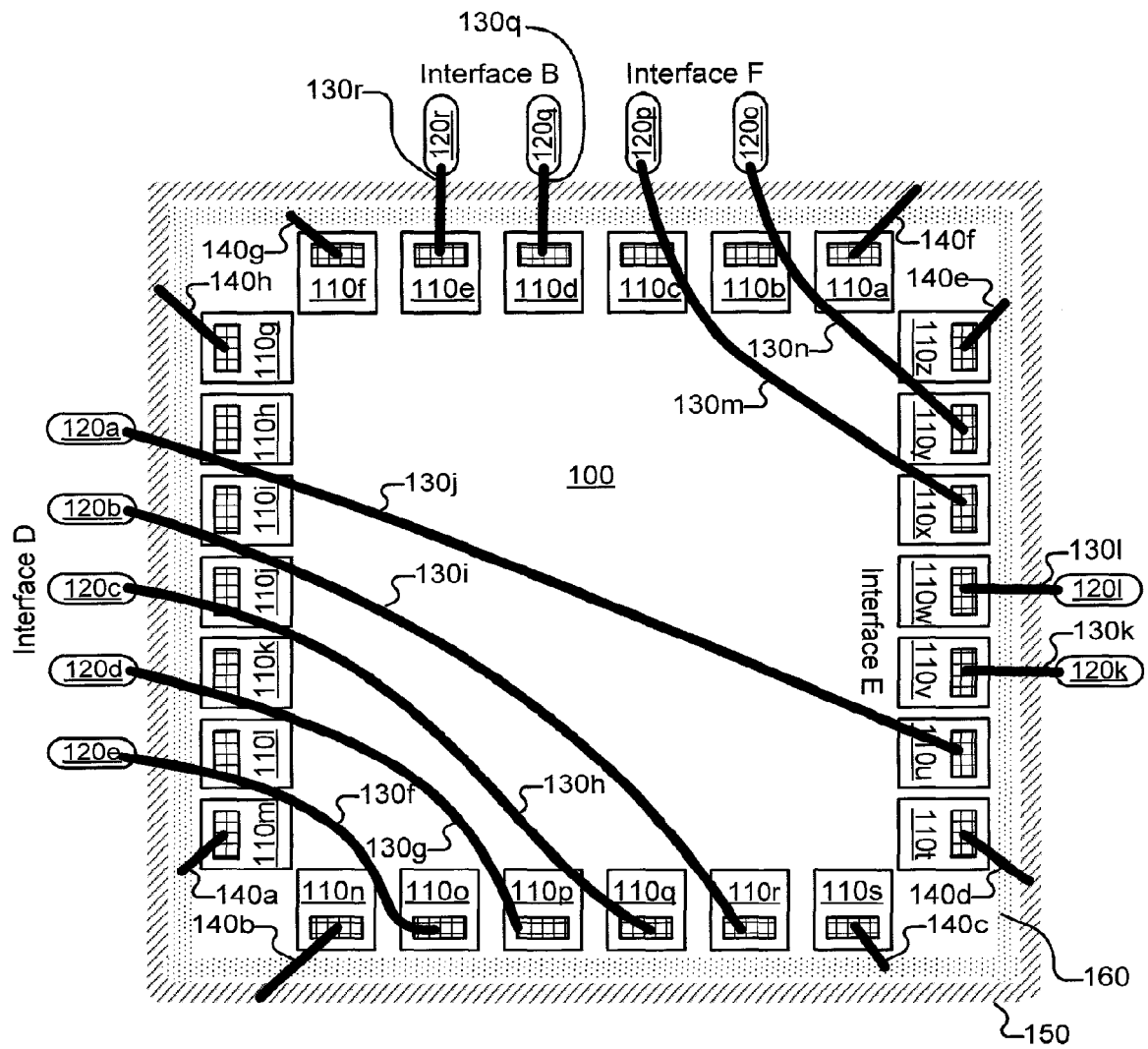

The present invention is related to connecting IO from a semiconductor die to a package. More particularly, the present invention is related to systems and methods for connecting one of multiple interface types implemented on a semiconductor die to appropriate pins on different packages encapsulating a substantially similar semiconductor die.

Various embodiments of the present invention provide multiple bond pads associated with each IO buffer of the design and a wire formed on a metallization layer that is used to connect select ones of the bond pads to each other to effectively move an IO buffer to a location nearer a package pin to which the IO buffer is to be bonded. This approach allows for the reuse of a substantially similar semiconductor die design to applications requiring different packages and/or IO configurations. Thus, for example, in a integrated circuit design destined for a variety of consumer products, the basic design can be reused by forming an wiring layer that allows the semiconductor die to be implemented in a customer selected package with a customer selected IO configurations with only a minimal modification to a standard semiconductor die.

Thus, for example, the same standard semiconductor die may be used in a system on a chip design incorporating a read channel, memory and logic may be utilized for multiple form factor hard drives (e.g., one inch form factor drives, 1.8 inch form factor drives and 2.5 inch form factor drives) and/or hybrid devices (e.g., memory plus hard drive devices) each of which may require varying IO interfaces to the host system. Each of the designs could be implemented to include a different IO configuration including, but not limited to, one or more of a USB, 1394, ATA or SATA interface. Thus, rather than develop separate designs for the aforementioned system on a chip and/or package for each form factor, a single semiconductor die may be manufactured, and different lots of the standard semiconductor design can be tooled by a post manufacturing metal etch or other wire formation process that allows for tailoring the design to a particular requirement.

Various embodiments of the present invention provide systems and methods for implementing multi-mode semiconductor devices. In particular, one embodiment of the present invention provides a multi-mode semiconductor device that includes a device package with a number of package pins. Such device package may be any device package known in the art including, but not limited to ball grid array packages, single-in-line packages, plastic leaded chip carrier packages and/or the like. Based on the disclosure provided herein, one of ordinary skill in the art will recognize a variety of package types with which embodiments of the present invention may be utilized.

The aforementioned semiconductor device includes a semiconductor die with a number of IO buffers. As used herein, the phrase "IO buffer" is used in its broadest sense to mean any location or device on a semiconductor die that is tailored for handing IO. Also, as used herein, the term "IO" is used in its broadest sense to mean any input and/or output transferring information between the semiconductor die and a package pin. As used herein, the phrase "semiconductor die" is used in its broadest sense to mean any die on which an integrated circuit is formed. Thus, for example, a semiconductor die may include, but is not limited to, a semiconductor substrate in which various circuits are formed along with various metal traces formed thereon to connect the various circuits.

One or more of the IO buffers include two or more bond pads. As used herein, the phrase "bond pad" is used in its broadest sense to mean any structure to which a bond wire may be attached. Thus, for example, a bond pad may be, but is not limited to, a metal area disposed above the semiconductor die. In some cases, one or more of the bond pads may be a floating pad. As used herein, the phrase "floating pad" is used in its broadest sense to mean any bond pad composed of an electrically conductive structure that is disposed over electrically conductive circuitry and/or wiring used to implement functionality unrelated to that served by the bond pad. Also, as used herein, the phrase "floating bond pad" is used in their broadest sense to mean any floating pad that is capable of attachment to a bond wire. In some instances, connection to one of the bond pads on the IO buffer is accomplished through use of a metal layer at a level coincident with the utilized bond pad. As used herein, the phrase "level coincident with the bond pad" is used in its broadest sense to mean at least a portion is at substantially the same level above an underlying semiconductor substrate. Thus, for example, implementing on a level coincident with the bond pad may include, but is not limited to, implementing atop the same insulating layer. Where a pad is a floating pad, connecting using a metal layer at a level coincident with the bond pad may involve a metal connecting either at the top or bottom of the bond pad. Thus, based on this description, one of ordinary skill in the art will recognize that there may be some leeway between a position above a top layer of a particular bond pad and below a bottom layer of the particular bond pad that would all be considered at a level coincident with the particular bond pad. In one particular case, the metal layer used to form the connection to the particular bond pad is the same metal layer used at least in part to form the bond pad itself.

In some cases, one of the bond pads associated with the IO buffer is electrically coupled to a circuit implementing one interface type, and the other bond pad is electrically coupled to a circuit implementing another interface type. Selection of one or the other of the two bond pads to wire bond to the package pin in proximity to the IO buffer selects the interface to be supported by the particular package pin. As used herein, the phrase "electrically coupled" is used in its broadest sense to mean any coupling whereby an electrical signal may be passed from one end point to another end point either directly or indirectly. Thus, for example, two nodes may be electrically coupled via a conductive wire in which case they would be directly coupled. In contrast, two nodes may be coupled by way of one or more circuit elements in which case they would be indirectly coupled.

In some cases, one or both of the aforementioned bond pads are implemented using CUP technology. As used herein, the phrase "CUP technology" is used in its broadest sense to mean any technology where circuitry is disposed under a pad. One of various examples of such CUP technology is discussed in U.S. Pat. No. 5,751,065 issued May 1998.

Figure 2A:
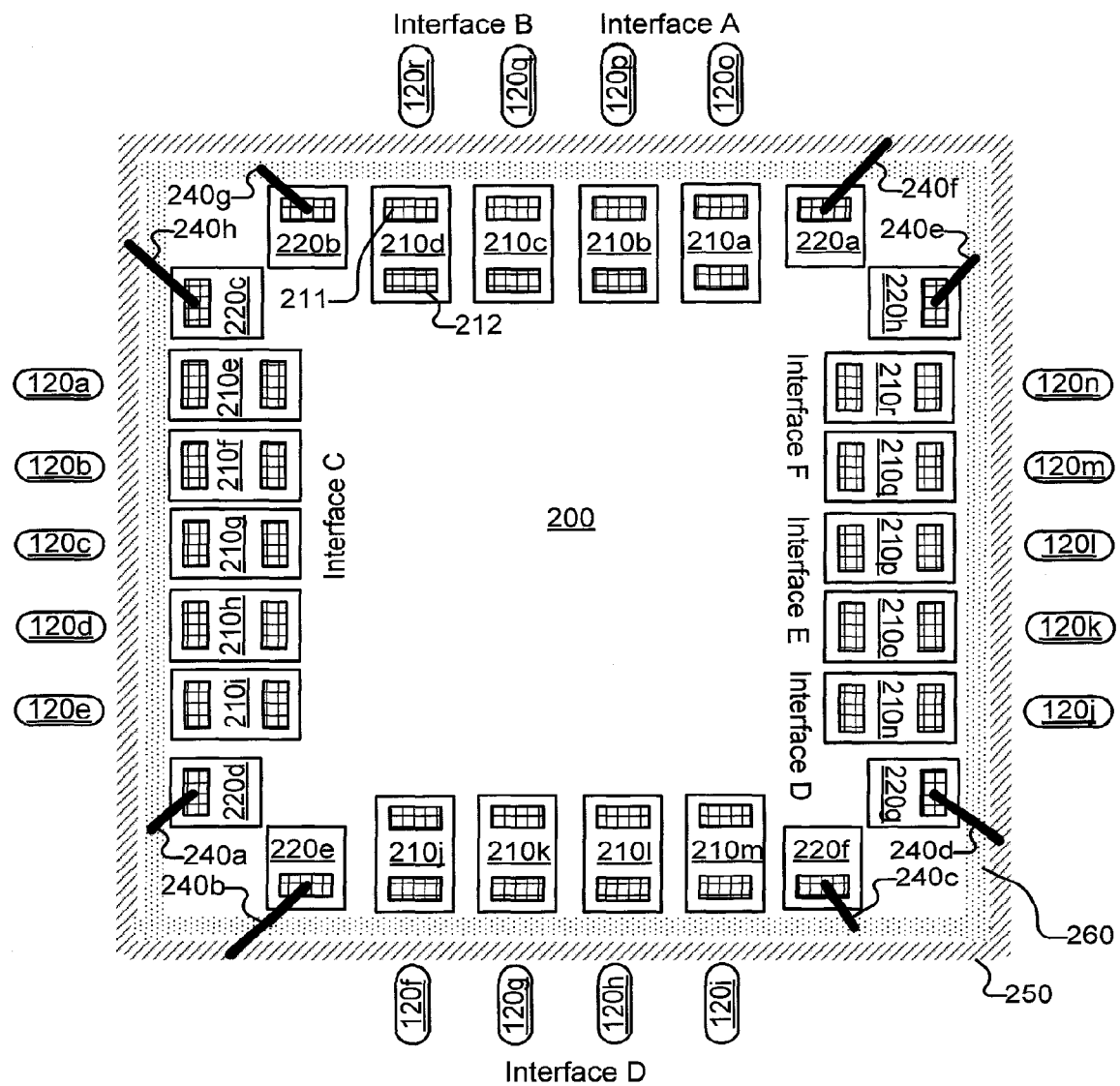
FIG. 2a depicts package pins in relation to a semiconductor die that includes multiple IO interfaces and multiple bond pads per IO buffer in accordance with various embodiments of the present invention.

Turning to FIG. 2a, a semiconductor die 200 is depicted in relation to a number of package pins 120. Semiconductor die 200 includes a number of IO buffers 220 that are bonded using bond wires 240 to a ground plane 250 indicated by the lined area surrounding semiconductor die 200, or to a power plane 260 indicated by the stippled area surrounding semiconductor die 200. In particular, IO buffer 220a, IO buffer 220c, IO buffer 220e and IO buffer 220g are bonded to ground plane 250; and IO buffer 220b, IO buffer 220d, IO buffer 220f and IO buffer 220h are bonded to power plane 260. Each of the aforementioned IO buffers includes only a single bond pad indicated by a cross hatched region on the respective IO buffer.

Other IO buffers 210 are disposed in proximity to package pins 120. In particular, IO buffer 210a is disposed in proximity to package pin 120o; IO buffer 210b is disposed in proximity to package pin 120p; IO buffer 210c is disposed in proximity to package pin 120q; IO buffer 210d is disposed in proximity to package pin 120r; IO buffer 210e is disposed in proximity to package pin 120a; IO buffer 210f is disposed in proximity to package pin 120b; IO buffer 210g is disposed in proximity to package pin 120c; IO buffer 210h is disposed in proximity to package pin 120d; IO buffer 210i is disposed in proximity to package pin 120e; IO buffer 210j is disposed in proximity to package pin 120f; IO buffer 210k is disposed in proximity to package pin 120g; IO buffer 210l is disposed in proximity to package pin 120h; IO buffer 210m is disposed in proximity to package pin 120i; IO buffer 210n is disposed in proximity to package pin 120*j*; IO buffer 210*o* is disposed in proximity to package pin 120*k*; IO buffer 210*p* is disposed in proximity to package pin 120*l*; IO buffer 210*q* is disposed in proximity to package pin 120*m*; and IO buffer 210*r* is disposed in proximity to package pin 120*n*. Each of the aforementioned IO buffers includes an inner bond pad 212 shown as a cross hatched area located on the core side of the respective IO buffer 210, and an outer bond pad 211 shown as another cross hatched area located on the package pin side of the respective IO buffer 210. As more fully described below, providing multiple bond pads 211, 212 on the same IO buffer allows for use of the IO buffer to connect different circuits implemented on semiconductor die 200 to a particular package pin located near the respective IO buffer 210.

Semiconductor die implements a number of IO interfaces. The IO interfaces are electrically coupled to respective sets of IO buffers via outer bond pads 211. Outer bond pads 211 are electrically connected to the IO interface circuitry by way of a via extending substantially vertically below the respective bond pads 211. In particular, semiconductor die 200 implements an interface A, an interface B, an interface C, an interface D, an interface E and an interface F. IO buffer 210*a* and IO buffer 210*b* are coupled to circuitry implementing interface A by way of a via extending between the outer bond pads of the respective IO buffers and the circuitry. IO buffer 210*c* and IO buffer 210*d* are coupled to circuitry implementing interface B by way of a via extending between the outer bond pads of the respective IO buffers and the circuitry. IO buffer 210*e*, IO buffer 210*f*, IO buffer 210*g*, IO buffer 210*h* and IO buffer 210*i* are coupled to circuitry implementing interface C by way of a via extending between the outer bond pads of the respective IO buffers and the circuitry. IO buffer 210*j*, IO buffer 210*k*, IO buffer 210*l*, IO buffer 210*m* and IO buffer 210*n* are coupled to circuitry implementing interface D by way of a via extending between the outer bond pads of the respective IO buffers and the circuitry. IO buffer 210*o* and IO buffer 210*p* are coupled to circuitry implementing interface E by way of a via extending between the outer bond pads of the respective IO buffers and the circuitry. IO buffer 210*q* and IO buffer 210*r* are coupled to circuitry implementing interface F by way of a via extending between the outer bond pads of the respective IO buffers and the circuitry.

Figure 2B:
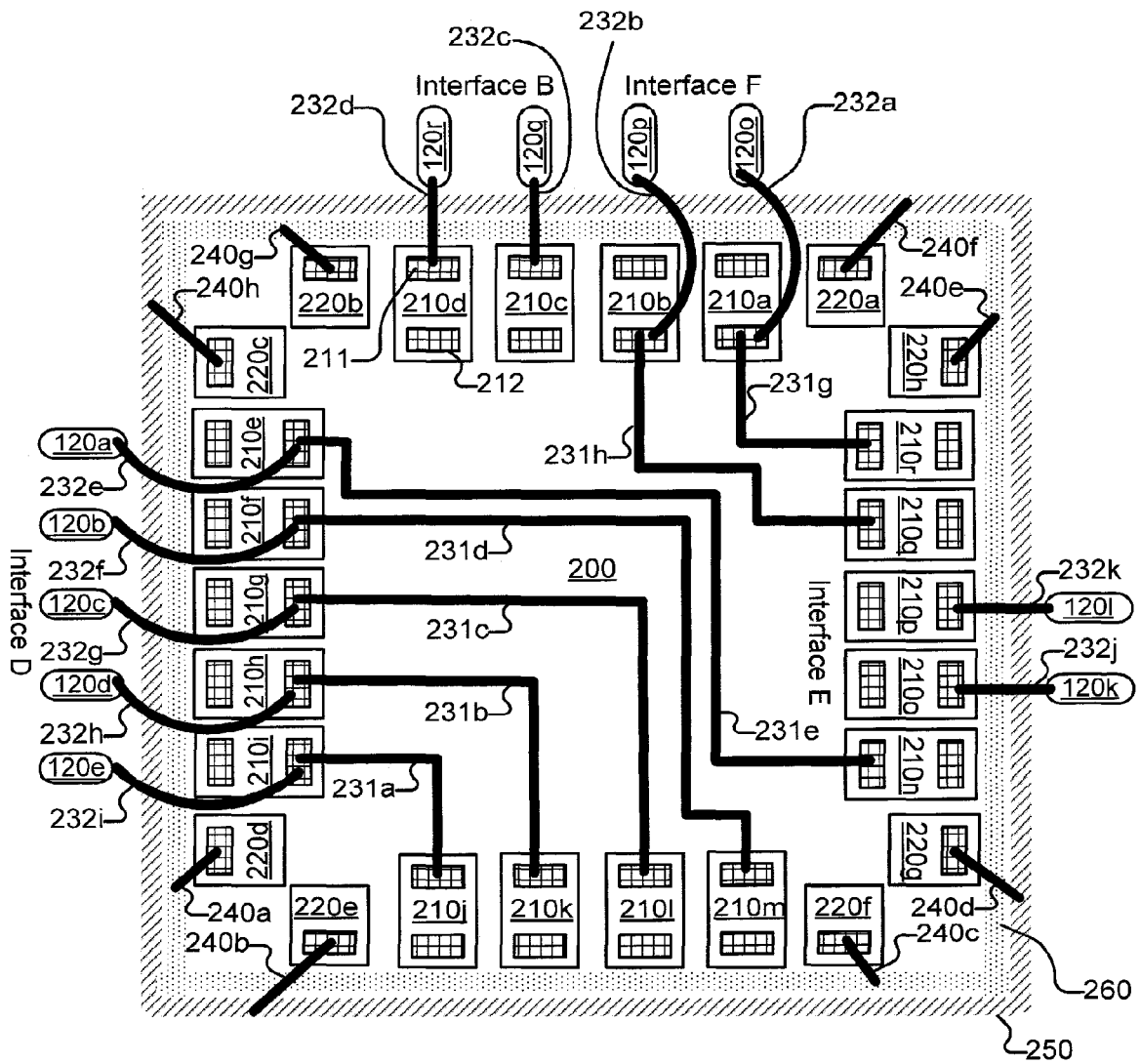
FIG. 2b depicts a subset of the package pins of FIG. 2b electrically coupled to the semiconductor die of FIG. 2b such that only a subset of the multiple IO interfaces are made available via the subset of the package pins in accordance with some embodiments of the present invention.

In the case where all of the aforementioned interfaces are to be available at package pins 120, a bond wire (not shown) would be connected between each of the outer bond pads and the package pin 120 that is closest to the IO buffer 210 that is associated with the particular package pin. However, where only a subset of package pins 120 exist and only a subset of the interfaces are to be made available at the package pins 120, inner bond pads 212 can be used to facilitate optimal bonding to the available package pins. Turning to FIG. 2*b*, an example of optimal bonding is depicted where only a subset of package pins 120 are available, and where only interface B, interface D, interface E and interface F are to be available at the package pins. More specifically, only package pin 120*a*, package pin 120*b*, package pin 120*c*, package pin 120*d*, package pin 120*e*, package pin 120*k*, package pin 120*l*, package pin 120*o*, package pin 120*p*, package pin 120*q*, and package pin 120*r* are available.

In this case, the inner pad of IO buffer 210*a* is electrically coupled to the inner pad of IO buffer 210*r* by a metal layer wire 231*g*, and the inner pad of IO buffer 210*r* is electrically coupled to the circuitry implementing interface F by way of a via extending to a metal layer at a level below metal layer wire 231*g* (or by connection to the outer pad of IO buffer 210*r*). In some cases, metal layer wires 231 are implemented in a single metal layer, while in other cases they are implemented using multiple metal levels with vias extending between the multiple metal layers. A bond wire 232*a* is then installed between the inner pad of IO buffer 210*a* and package pin 120*o*. Similarly, the inner pad of IO buffer 210*b* is electrically coupled to the inner pad of IO buffer 210*q* by a metal layer wire 231*f*, and the inner pad of IO buffer 210*q* is electrically coupled to the circuitry implementing interface F by way of a via extending to a metal layer at a level below metal layer wire 231*f* (or by connection to the outer pad of IO buffer 210*q*). A bond wire 232*b* is then installed between the inner pad of IO buffer 210*b* and package pin 120*p*. In this way, circuitry (i.e., the circuitry of interface F) that is as a default supported by IO buffer 210*r* and IO buffer 210*q* becomes supported by IO buffer 210*a* and IO buffer 210*b*; and circuitry (i.e., the circuitry of interface A) that is as a default supported by IO buffer 210*a* and IO buffer 210*b* is effectively disconnected.

The inner pad of IO buffer 210*e* is electrically coupled to the inner pad of IO buffer 210*n* by a metal layer wire 231*e*, and the inner pad of IO buffer 210*n* is electrically coupled to the circuitry implementing interface D by way of a via extending to a metal layer at a level below metal layer wire 231*e* (or by connection to the outpour pad of IO buffer 210*n*). A bond wire 232*e* is then installed between the inner pad of IO buffer 210*e* and package pin 120*a*. Similarly, the inner pad of IO buffer 210*f* is electrically coupled to the inner pad of IO buffer 210*m* by a metal layer wire 231*d*, and the inner pad of IO buffer 210*m* is electrically coupled to the circuitry implementing interface D by way of a via extending to a metal layer at a level below metal layer wire 231*d* (or by connection to the outer pad of IO buffer 210*m*). A bond wire 232*f* is then installed between the inner pad of IO buffer 210*f* and package pin 120*b*. The inner pad of IO buffer 210*g* is electrically coupled to the inner pad of IO buffer 210*l* by a metal layer wire 231*c*, and the inner pad of IO buffer 210*l* is electrically coupled to the circuitry implementing interface D by way of a via extending to a metal layer at a level below metal layer wire 231*c* (or by connection to the outer pad of IO buffer 210*l*). A bond wire 232*g* is then installed between the inner pad of IO buffer 210*g* and package pin 120*c*. The inner pad of IO buffer 210*h* is electrically coupled to the inner pad of IO buffer 210*k* by a metal layer wire 231*b*, and the inner pad of IO buffer 210*k* is electrically coupled to the circuitry implementing interface D by way of a via extending to a metal layer at a level below metal layer wire 231*b* (or by connection to the outer pad of IO buffer 210*k*). A bond wire 232*h* is then installed between the inner pad of IO buffer 210*h* and package pin 120*d*. The inner pad of IO buffer 210*i* is electrically coupled to the inner pad of IO buffer 210*j* by a metal layer wire 231*a*, and the inner pad of IO buffer 210*j* is electrically coupled to the circuitry implementing interface D by way of a via extending to a metal layer at a level below metal layer wire 231*a* (or by connection to the outer pad of IO buffer 210*j*). A bond wire 232*i* is then installed between the inner pad of IO buffer 210*i* and package pin 120*e*. In this way, circuitry (i.e., the circuitry of interface D) that is as a default supported by IO buffer 210*j*, IO buffer 210*k*, IO buffer 210*l*, IO buffer 210*m* and IO buffer 210*n* becomes supported by IO buffer 210*e*, IO buffer 210*f*, IO buffer 210*g*, IO buffer 210*h* and IO buffer 210*i*; and circuitry (i.e., the circuitry of interface C) that is as a default supported by IO buffer 210*e*, IO buffer 210*f*, IO buffer 210*g*, IO buffer 210*h* and IO buffer 210*i* is effectively disconnected.

Interface B is connected by installing a bond wire 232c between the outer pad of IO buffer 210c and package pin 120q and bond wire 232d between the outer pad of IO buffer 210d and package pin 120r. In this case, the inner pads of IO buffer 210c and IO buffer 210d are left unused. Interface E is connected by installing a bond wire 232j between the outer pad of IO buffer 210o and package pin 120k and bond wire 232k between the outer pad of IO buffer 210p and package pin 120l. In this case, the inner pads of IO buffer 210o and IO buffer 210p are left unused. While FIG. 2 are shown as including two bond pads per IO buffer, based on the disclosure provided herein, one of ordinary skill in the art will recognize that embodiments with three or more bond pads per IO buffer may be implemented in accordance with other embodiments of the present invention.

Figure 3:
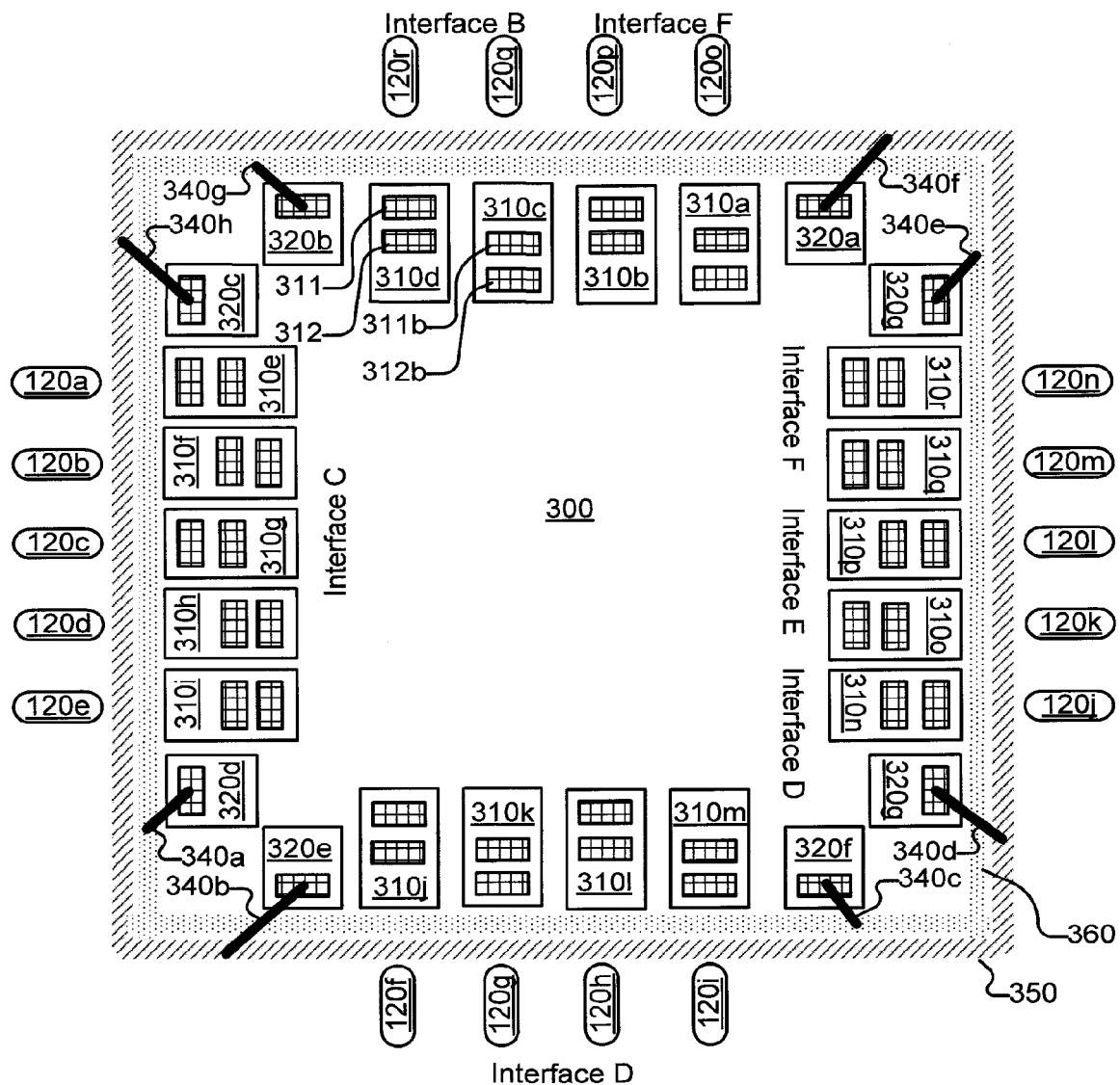
FIG. 3 depicts package pins in relation to a semiconductor die that includes multiple IO interfaces and multiple bond pads per IO buffer with the bond pads staggered in accordance with other embodiments of the present invention.

Turning to FIG. 3, a semiconductor die 300 is depicted in relation to a number of package pins 120. Semiconductor die 300 includes a number of IO buffers 320 that are bonded using bond wires 340 to a ground plane 350 indicated by the lined area surrounding semiconductor die 300, or to a power plane 360 indicated by the stippled area surrounding semiconductor die 300. In particular, IO buffer 320a, IO buffer 320c, IO buffer 320e and IO buffer 320g are bonded to ground plane 350; and IO buffer 320b, IO buffer 320d, IO buffer 320f and IO buffer 320f are bonded to power plane 360. Each of the aforementioned IO buffers includes only a single bond pad indicated by a cross hatched region on the respective IO buffer.

Other IO buffers 310 are disposed in proximity to package pins 120. Each of IO buffers 310 includes an inner bond pad 312 shown as a cross hatched area located on the core side of the respective IO buffer 310, and an outer bond pad 311 shown as another cross hatched area located on the package pin side of the respective IO buffer 310. The inner and outer bond pads of IO buffers 310 may be utilized in similar fashion to that described above in relation to FIG. 2. In contrast to that described in relation to FIG. 2a above, the inner and outer bond pads are staggered between adjacent IO buffers 310 such that the outer bond pad on one IO buffer is closer to the outer edge of die 300 than the corresponding outer bond pad of an adjacent IO buffer. Similarly, the inner bond pad of one IO buffer is closer to the core of semiconductor die 300 than the inner bond pad of an adjacent IO buffer. Such staggering may be used to reduce the pitch of any bond wires ultimately installed between an IO buffer 310 and a proximate package pin 120. Based on the disclosure provided herein, one of ordinary skill in the art will recognize other staggering schemes that may implemented in relation to one or more embodiments of the present invention.

Figure 4:
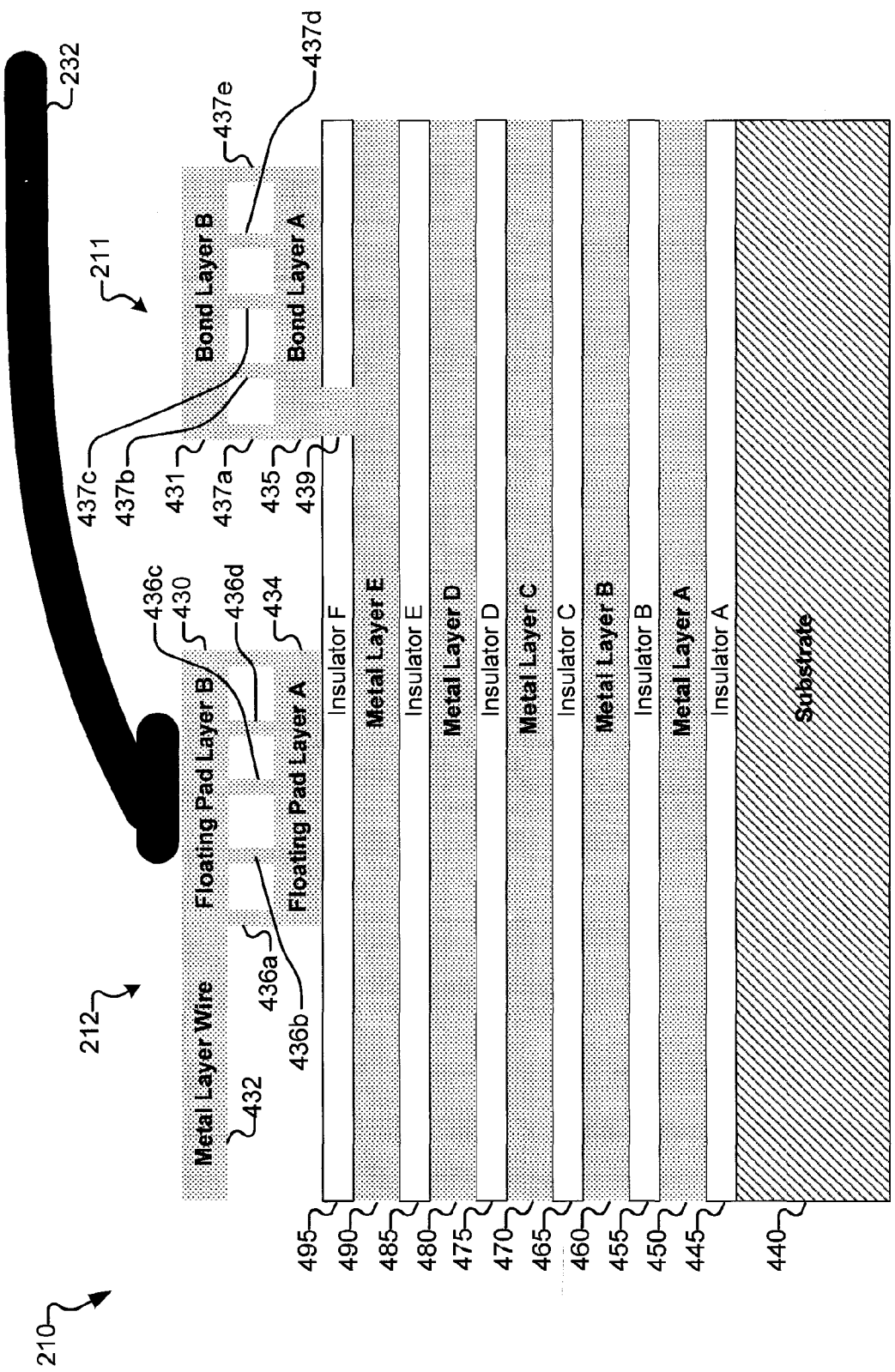
FIG. 4 is a cross sectional view of a semiconductor device including multiple bond pads per IO buffer where one of the multiple bond pads is a floating pad in accordance with various embodiments of the present invention.

Turning to FIG. 4, a cross sectional diagram of an IO buffer 210 of FIG. 2 is depicted. As shown, IO buffer 210 includes a semiconductor substrate 440 with a number of metal layers 450, 460, 470, 480, 490 disposed thereon. In some cases, metal layers 450, 460, 470, 480, 490 are implemented in copper. Each of metal layers 450, 460, 470, 480, 490 is separated from adjacent metal layers and semiconductor substrate 440 by insulating layers 445, 455, 465, 475, 485, 495. In addition, IO buffer 210 includes inner bond pad 212 and outer bond pad 211. Inner bond pad 212 includes two bond pad layers 430, 434 interconnected by a number of vias 436. Connection of multiple layers may reduce stress caused by mechanical movement between the layers. Inner bond pad 212 is further connected or connectable using a metal layer wire 432. In some case, metal layer wire 432 is implemented in aluminum along with pad layer 430. Outer bond pad 211 includes two bond pad layers 431, 435 interconnected by a number of vias 437. Again, connection of multiple layers may reduce stress caused by mechanical movement between the layers. Outer bond pad 211 is connected to underlying circuitry by way of a via 439. As shown, via 439 electrically couples bond pad 211 to a wire on metal layer 490, but could connect bond pad 211 to lower metal layers where such was desired. A bond wire 232 may be bonded to either inner bond pad 212 or outer bond pad 211 depending upon the desired circuit connection.

Figure 5:
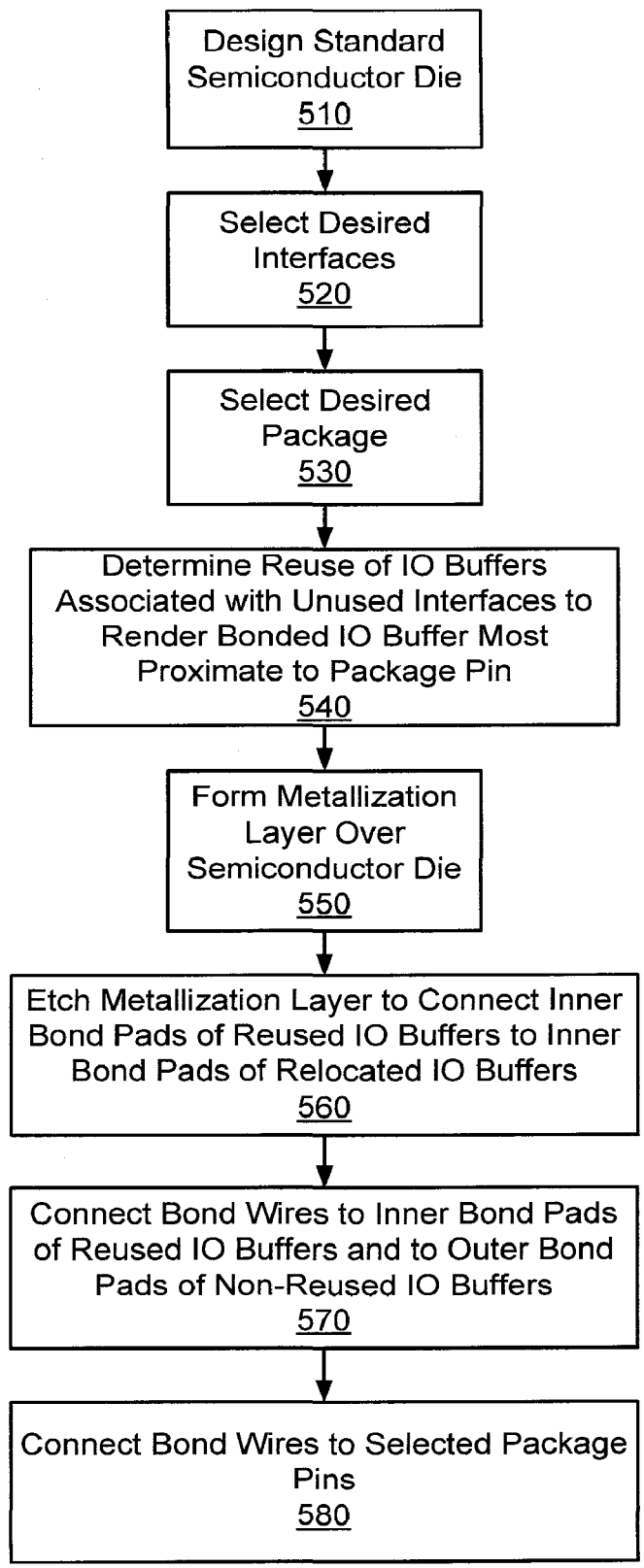
FIG. 5 is a flow diagram showing a process for manufacturing and packaging a multi-mode semiconductor device in accordance with one or more embodiments of the present invention.

Turning to FIG. 5, a flow diagram 500 shows a process for manufacturing and packaging a multi-mode semiconductor device in accordance with one or more embodiments of the present invention. Following flow diagram 500, a standard semiconductor die is designed that includes a plurality of interfaces (block 510). One or more of the plurality of interfaces are selected to be made available at the package pins (block 520), and a package suitable for encapsulating the semiconductor die is selected (block 530). The aforementioned processes result, for example, in the reduction of package pins shown between FIG. 2a and FIG. 2b above. It is then determined if some of the IO buffers associated with interfaces that are not to be made available at the package pins may be reused to implement one or more of the interfaces that are to be included (block 540). Thus, using the example shown in the transition between FIG. 2a and FIG. 2b above, it is determined that the interface that is by default served by IO buffers 210j, 210k, 210l, 210m, 210n will be relocated to reuse the otherwise unused IO buffers 210e, 210f, 210g, 210h, 210i. Further, the interface that is by default served by IO buffers 210q, 210r will be relocated to reuse the otherwise unused IO buffers 210a, 210b. In some cases, this determination can be made by determining whether one of the otherwise unused IO buffers is closer to a package pin than one of the used IO buffers.

Once the aforementioned determination is made, a metallization layer is formed over the standard semiconductor die (block 560). This metallization layer can be formed in any number of ways including, but not limited to, a deposition process. The metallization layer is then etched or otherwise manipulated to connect the inner bond pads of IO buffers that are to be reused with the inner bond pads of IO buffers that are to be relocated (block 560). The aforementioned process results in metal layer wires 231 depicted in FIG. 2b above. Bond wires are attached to the utilized bond pad of each of the IO buffers (block 570). Using the example of FIG. 2b, the aforementioned step includes attaching a bond wire to the inner bond pad of IO buffers that are being reused (e.g., IO buffer 210a), and attaching a bond wire to the outer bond pad of IO buffers that are not reused (e.g., IO buffer 210c). In addition, bond wires are placed from the selected IO buffers to select package pins (block 580). This results in, for example, bond wires 232 from the various IO buffers 210 to package pins 120 of FIG. 2b.

In conclusion, the present invention provides novel systems, devices, methods and arrangements for semiconductor device implementation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A multi-mode semiconductor device, wherein the semiconductor device comprises:
a device package, wherein the device package includes a package pin; and a semiconductor die, wherein the semiconductor die includes:
a first IO buffer located a first distance from the package pin and a second IO buffer located a second distance from the package pin, wherein the first distance is less than the second distance, wherein the first IO buffer includes a first bond pad electrically coupled to a circuit implementing a first interface type and a floating bond pad, and wherein the second IO buffer includes a second bond pad electrically coupled to a circuit implementing a second interface type.

2. The semiconductor device of claim 1, wherein the floating bond pad is electrically coupled to the circuit implementing the second interface type via a metal layer wire, and wherein the floating bond pad is electrically coupled to the package pin.

3. The semiconductor device of claim 2, wherein the metal layer wire is on a metal layer at a level coincident with the first floating bond pad.

4. The semiconductor device of claim 3, wherein the metal layer is an aluminum metal layer, and wherein the floating bond pad is formed of aluminum.

5. The semiconductor device of claim 2, wherein the second interface type is selected from a group consisting of:
a USB interface,
a 1394 interface, and
an ATA interface.

6. The semiconductor device of claim 1, wherein:
the first bond pad is electrically coupled to the circuit implementing the first interface type by way of a first via extending substantially vertically below the first bond pad; and
the second bond pad is electrically coupled to the circuit implementing the second interface type by way of a second via extending substantially vertically below the second bond pad.

7. The semiconductor device of claim 6, wherein the second bond pad is implemented in aluminum, and wherein the via connects the second bond pad to a copper metal layer.

8. A multiple IO supporting semiconductor device, the semiconductor device comprising:
an IO buffer, wherein the IO buffer is located in proximity to a device package pin, wherein the IO buffer includes a first bond pad and a second bond pad, and wherein only one of the first bond pad and the second bond pad is electrically coupled to the device package pin;
wherein the first bond pad is electrically coupled to a driver circuit element via a metal layer wire on a metal layer at a level coincident with the first bond pad; and
wherein the metal layer is an aluminum metal layer.

9. The semiconductor device of claim 8, wherein one of the first bond pad and the second bond pad is a floating pad.

10. The semiconductor device of claim 8, wherein the driver circuit element is a first driver circuit element, wherein the second bond pad is electrically coupled to a second driver circuit element by way of a via extending substantially vertically below the second bond pad.

11. The semiconductor device of claim 10, wherein the second bond pad is implemented in aluminum, and wherein the via connects the second bond pad to a copper metal layer.

12. The semiconductor die of claim 11, wherein at least one of the first bond pad and the second bond pad is implemented using CUP technology.

13. The semiconductor device of claim 10, wherein the first driver circuit element is associated with a first interface type, and wherein the second driver circuit element is associated with a second interface type.

14. The semiconductor device of claim 10, wherein:
the device package pin is associated with a device package;
wherein the device package encapsulates the semiconductor device; and
wherein only one of the first interface type and the second interface type is provided at the IO of the device package.

15. The semiconductor device of claim 14, wherein the both the first interface type and the second interface type are available on the semiconductor device.

16. A method for manufacturing a multi-mode semiconductor device, the methods comprise:
providing a semiconductor die, wherein the semiconductor die includes a first IO buffer and a second IO buffer, wherein the first IO buffer includes a first bond pad electrically coupled to a circuit implementing a first interface type and a floating bond pad, and wherein the second IO buffer includes a second bond pad electrically coupled to a circuit implementing a second interface type;
providing a package, wherein the package includes a package pin;
forming a metallization layer;
forming a wire in the metallization layer, wherein the floating bond pad is electrically coupled to the second bond pad, wherein the floating bond pad is electrically coupled to the circuit implementing the second interface type via the second bond pad; and
placing a bond wire electrically coupling the floating bond pad to the package pin.

17. The method of claim 16, wherein the metallization layer is on the same level as the floating bond pad.

18. The method of claim 16, wherein:
the first interface type is selected from a group consisting of:
a USB interface,
a 1394 interface, and
an ATA interface; and
the second interface type is selected from a group consisting of:
a USB interface,
a 1394 interface, and
an ATA interface.

* * * * *